United States Patent [19]

Hebert

[11] Patent Number: 4,733,121
[45] Date of Patent: Mar. 22, 1988

[54] SOLID STATE HEAT TO ELECTRICITY CONVERTER

[76] Inventor: Alvin J. Hebert, 1232 W. 186th St., Gardena, Calif. 90248

[21] Appl. No.: 918,071

[22] Filed: Oct. 14, 1986

[51] Int. Cl.[4] .............................................. H01L 41/08
[52] U.S. Cl. .................................. 310/311; 310/328; 310/331; 310/339; 310/369; 310/26
[58] Field of Search ........ 310/311, 323, 339, 328–332, 310/314, 317, 366, 319, 369, 26; 322/2 R; 244/158 R, 159; 372/9, 12, 19, 38, 69, 72, 77, 81, 98, 101; 455/609

[56] References Cited

U.S. PATENT DOCUMENTS

| | | | |
|---|---|---|---|
| 3,198,969 | 8/1965 | Kolm et al. | 310/328 X |
| 3,234,413 | 2/1966 | Howatt et al. | 310/330 X |
| 3,246,287 | 4/1966 | Benson | 310/328 X |
| 3,255,401 | 6/1966 | Kolm et al. | 310/328 X |
| 3,822,388 | 7/1974 | Martini et al. | 310/328 X |

OTHER PUBLICATIONS

Pyroelectric Conversion Cycle of Vinylidene Floride Trifluoroethylene Copolymer, by Olsen et al. JAP 57(11) Jun. 1, 1985, pp. 5036.
55-Nitinol-The Alloy with a Memory: Its Physical Metallurgy, Properties, and Applications, a report by C. M. Jackson, NASA, 1972, NASA-SP 5110.
Composite Electroceramics by R. E. Newham, Ferroelectrics, vol. 68, 1986, pp. 22–25.
Composite Piezoelectric Transducers, R. E. Newnham et al., Materials Research Laboratory Penn State University, U.S.A. 16802, (undated).
High Electric Field Resistivity & Piezoelectric Properties of Vinylidene Fluoride Trifluoroethylene Copolymer by Olsen et al., JAP, 58(8), Oct. 15, 1985, p. 2854.

Primary Examiner—Mark O. Budd

[57] ABSTRACT

The conversion of heat energy to electrical energy is realized by coupling memory materials to piezoelectric materials or to composite magnetoelectric materials and by subsequent hot-cold-strain cycling of the memory material. Embodiments of the invention provide solid state inverters, particle acceleration and focusing devices, and automatic hot-cold-strain cycling motor, and high voltage heat to electricity converters.

13 Claims, 7 Drawing Figures

SOLID STATE HEAT TO ELECTRICITY CONVERTER

This application relates to U.S. patent disclosure documents Ser. Nos. 137,037 filed Apr. 22, 1985, and 151,532 filed Jun. 9, 1986.

BACKGROUND

Piezoelectric, ferroelectric, and pyroelectric materials that are capable of converting heat to electricity have been studied for over 20 years. In recent years, ceramics, polymer, copolymer, and composite materials have been produced that have pyroelectric and piezoelectric energy density capabilities of the order of hundreds of kilojoules per cubic meter, or several joules per cubic inch.

Recent lightweight composite electroactive materials have been produced that have weight densities ranging down to one eighth of the density of ceramic piezoelectric materials, and they have comparable energy density capabilities. The new composites also feature magnetoelectric materials that can be poled to generate parallel electric and magnetic fields. Laminated piezoelectric materials have been used as microwave filters and as piezoelectric transformers and amplifiers for many years, however, only recently has a new multiphase composite material allowed production of a Navy hydrophone with a figure of merit 1,000 times that of single phase material.

In recent years, direct drive motors have been constructed with piezoelectric ceramics. The motors are lightweight, compact, and require no field windings. They are capable of providing high torque at low speeds.

Piezoelectric materials may be operated as detectors of vibrational or acoustic energy with high mechanical to electrical energy conversion efficiencies. Conversely, high voltage excitation of piezoelectric materials provides radiated vibrational or acoustic energy, and at higher frequencies, such excitation can provide high power electromagnetic radiation output. The high voltage generating capabilities of piezoelectric materials, as well as their ability to capacitively store electrostatic and magnetostatic energy make the materials attractive as particle acceleration and focusing devices and as energy sources or pumps for klystrons, masers, and lasers. Thinly laminated piezoelectric or composite materials can be impedance matched to diode or transistor varactors for harmonic signal generation and modulation, or to solid state photodetectors, masers, and lasers in compact, rugged packages.

Two major problems with pyroelectric materials are their relatively long cycling times arising from low thermal conductivities, and their lack of long term reliable cyclic operation.

The response time and the cycling abilities of a pressurizing means become important factors when considering pressure activated piezoelectric or composite materials as transceivers for communications or as power transfer and conversion systems.

There are two broad classes of materials that exhibit memory or shape recovery properties on absorbing or radiating heat. They are alloys (or alloy composites) and polymers (or polymer composites) that convert absorbed and radiated heat to mechanical work. Memory materials have been reported that are capable of exerting pressures or forces of the order of 100,000 pounds per square inch of memory material cross sectional area. Polymer and composite memory materials exert forces and perform mechanical work on being cooled, while memory alloys and composites perform mechanical work on being heated.

Memory alloys and alloy composites typically have thermal conductivities of the order of 100 times the thermal conductivities of polymer, composite polymer, or ceramic materials. They are thus capable of much shorter response times and more rapid cycling rates. One memory alloy material has been observed to exhibit a response time of 0.01 seconds. Memory alloys have been reported to have reliable cycling capabilities through ten million cycles. Reliable cycling ability has been reported to be a logarithmic function of strain, and reliable cycling capabilities of the order of a billion cycles at strains of the order of one percent are predicted. Thus, long term reliable cycling capabilities for memory materials of the order of years at cycling rates of 60 cycles per second are predicted.

Typical ceramic piezoelectric compression strains are of the order of $10^{-3}$ or 0.001 percent for optimum operation, while memory alloys operate optimally at strains of the order of a thousand times greater, or a few percent or less. Therefore, a pressure transmitting means or spring material that provides a mechanical impedance match between piezoelectric materials and memory materials, while also acting as a safety means to eliminate inelastic strain in the memory material and thus increase reliable lifetimes, may be incorporated as a separate means, or embodied as a component or compound in ceramic or composite magnetoelectric materials. Memory alloy materials have been produced that reportedly require no spring means to return the material to a desired geometry on cooling, however such materials are not currently available at reasonable cost, and there is no present guarantee that they will be capable of being mechanically impedance matched to electroactive materials.

Both memory materials and poled piezoelectric or magnetoelectric materials may be rejuvinated when performance degrades. Therefore, construction of a preferred form of the invention that allows rejuvination of these materials without disassembly of the invention is advantageous from an economic point of view, and in situations where disassembly is not practicable.

The transition temperature for memory alloys can be specified over a range of the order of 300° C. by specifying the elemental composition of the memory alloy. Thus, a specified transition temperature in the range of −200° to +100° C. can be readily accomplished. The range in temperature over which the memory transition occurs can be of the order of one °C.

A thermodynamic Carnot efficiency of 27 percent has been reported for a mechanical memory alloy machine, where the memory alloy performed work in a flexure or bending mode to turn a wheel. The development of recent new memory alloys and memory composites is expected to allow applications that readily exceed this efficiency when the memory alloy is operated in a pure tension mode and coupled to high efficiency piezoelectric materials. Future advancements in memory composite materials fabrication are expected to provide materials with higher thermal conductivities and emissivities that will further enhance their thermodynamic efficiency and result in more rapid and reliable hot-cold-strain cycling characteristics.

BRIEF SUMMARY OF THE INVENTION

Therefore, in practice of this invention according to a presently preferred embodiment, piezoelectric, ferroelectric, or composite magnetoelectric materials operate in concert with memory materials to convert heat to electrical energy. The invention may be operated as an inverter by means of low voltage heating of electrically conductive memory material with a resultant high voltage output. The invention may also be operated as a particle acceleration and focusing device. Embodiments of a compliant or spring-like pressure transmitting means in the invention allows long term reliable cycling and mechanical impedance matching of memory materials to piezoelectric or magnetoelectric materials and composites. The compact and rugged construction of the invention reliably facilitates power input densities of the order of a kilowatt per cubic inch of electroactive or magnetoelectric material at total weights for the invention corresponding to a kilowatt per pound. A further object of the invention is the provision of automatic hot-cold-strain cycling means whereby heat is transferred to and from the memory materials in embodiments of the invention that allow the use of combustible gases or solar energy and liquids as hot and cold reservoirs, and whereby composite magnetoelectric converters acting in concert with stationary magnets comprise a rotary motor that rotates the converters through hot and cold regions, while the converters simultaneously provide electricity generated by the piezoelectric effect. One embodiment of the invention also provides means for the rejuvination of memory and electroactive materials without disassembly.

DRAWINGS

These and other features and advantages of the present invention will be appreciated as the same better understood by reference to the following detailed description of a presently preferred embodiment when considered in connection with the accompanying drawings wherein.

DESCRIPTION

Figure 1:
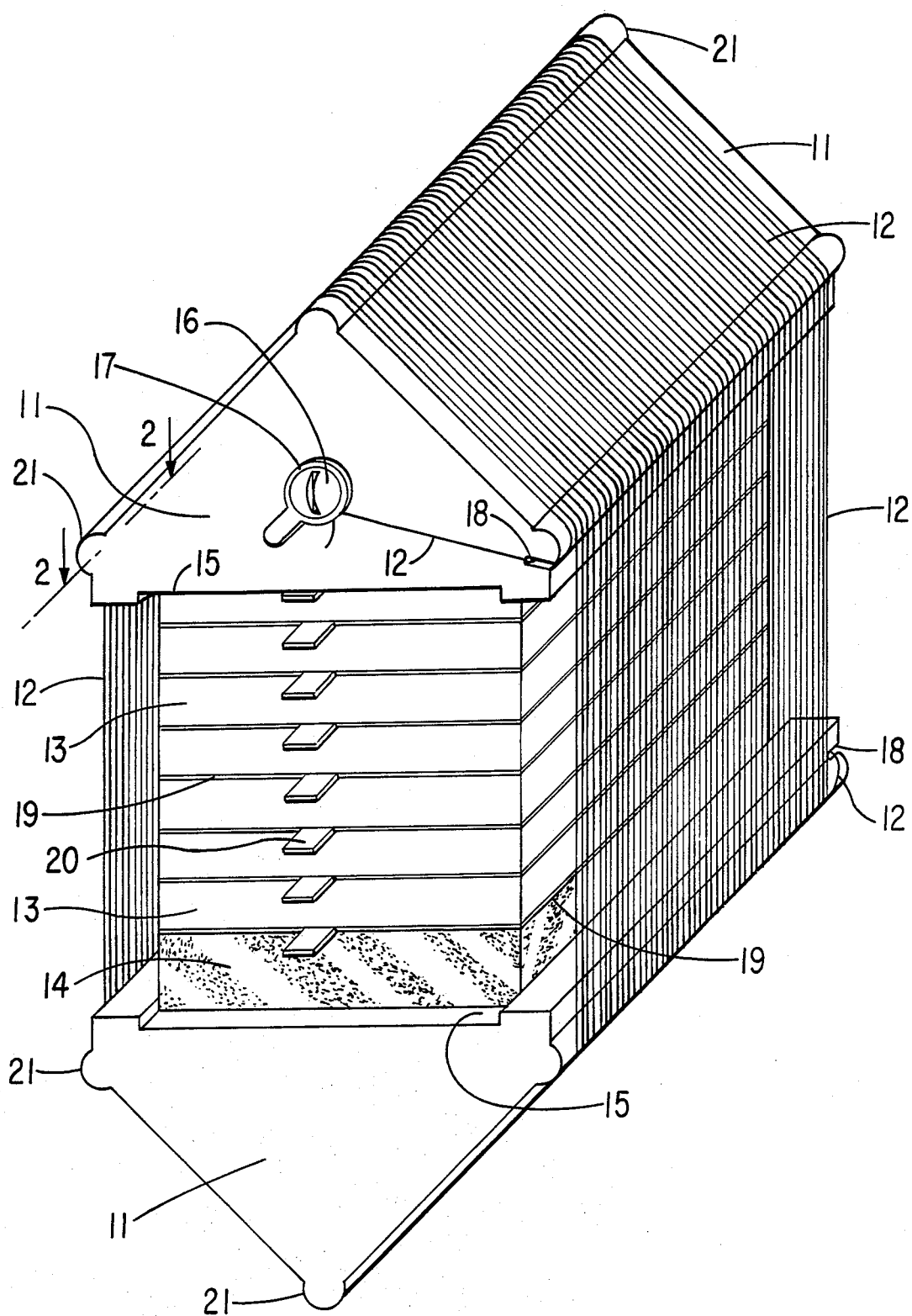
FIG. 1 illustrates in perspective view an embodiment of heat to electricity converter constructed according to the principles of this invention.

FIG. 1 illustrates in perspective view one embodiment of a heat to electricity converter constructed according to principles of this invention that is capable of high voltage generation as well as electrostatic and magnetic energy generation and storage. As illustrated in this embodiment, identical thermally and electrically insulating prismatic pressure plates 11 are held in place by memory wire 12 that is wound in a coil-like manner under relatively low tension, and at a temperature below the memory wire transition temperature, around two identical prismatic pressure plates 11, a block of several electroactive piezoelectric, ferroelectric, or composite electroactive material laminated plates 13, and a mechanical impedance matching pressure transmitting spring material plate 14. Smooth surfaced recesses 15 in the bases of the plates 11 match the surfaces of the electroactive plates 13 and the spring material plate 14.

An example of material that is suitable for fabrication of the spring material plate 14 is cast polyurethane.

The continuous strand of memory wire 12 is held in tension, amounting to a few hundred pounds per square inch of wire cross sectional area, by tie-down screws 16 and electrically conductive electrode-washers 17 at both the upper front surface and at the lower rear surface of the identical pressure plates 11 shown in FIG. 1. Grooves 18 in the pressure plates 11 facilitate a smooth transition from the coil-like winding to termination of the memory wire 12 at the tie-down screws 16.

The laminated plates 13 have electrically conducting electrode surfaces 19 and extended electrode tabs 20 to facilitate electrical output connections and use of the time varying electrical potential generated during hot-cold-strain cycling of the memory wire 12.

Figure 2:
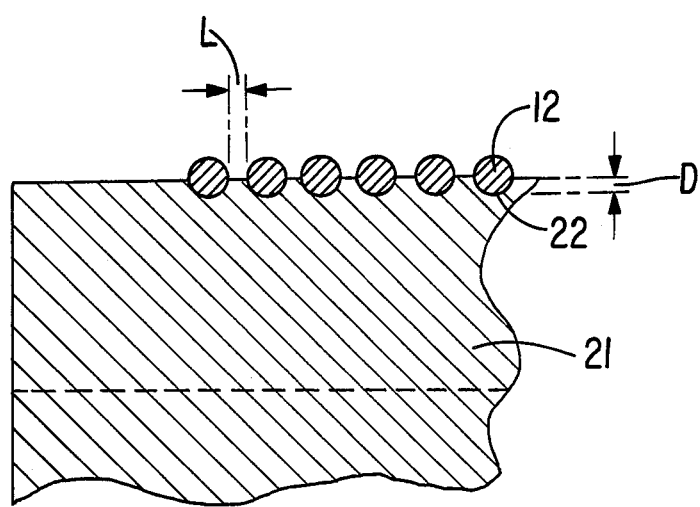
FIG. 2 is an enlarged cross sectional detail of a portion of a prismatic pressure plate, taken along line 2—2 of FIG. 1.

FIG. 2 illustrates an enlarged sectional view of a portion of the six memory wire 12 standoff vertices 21 on the prismatic pressure plates 11 shown in FIG. 1, where shallow channels 22 that match the memory wire 12 radius and have depths D less than the wire radius, serve to separate each turn of wire, and act as winding guides to insure electrical isolation between successive memory wire turns. The spacing L between successive wire turns is of importance since it determines the number of wire turns, and thus the memory wire tension force and pressure transmitted through the pressure plates 11, the spring material plate 14, and to the electroactive material plates 13. The flow of heat to and from the memory wire during hot-cold-strain cycling is also dependent on the spacing L. For these reasons, careful consideration is given to the tensile strength of the memory wire 12, the optimum strain desired in the wire, the spring constant of the spring material plate 14, the compressive strengths of the pressure plates 11, and the long term recommended cyclic compressive strength of the electroactive material plates 13 to arrive at optimum mechanical impedance matching and heat transfer to and from the memory wire 12 during hot-cold-strain cycling. The contact surface area between the memory wire 12 and the channels 22 shown in FIG. 2 is determined by the compressive strength of the pressure plates 11 and is minimized to allow maximum memory wire surface area access to the hot-cold-strain cycling reservoirs. This minimized area of contact between the memory wire and the pressure plates in conductive to long term reliable cycling of the memory wire, since temperature gradients in the wire near the contact surfaces will be less pronounced and will result in more rapid memory wire response times, less internal friction and inelastic strain in the memory wire, and a lowered incidence of memory wire fatigue failure.

The pressure plates 11 may be fabricated by casting and/or machining.

If a lowering of the efficiency of operation of the memory wire occurs, the wire may be rejuvinated by passing an electrical current through the wire by means of an appropriate electrical source that is connected to the electrode-washers 17, and with subsequent resistive heating of the memory wire 12 to a prescribed temperature. In a similar manner, the electroactive material plates 13 may be repoled and rejuvinated without disassembly by placing this embodiment of the invention in a hot oil bath that has a high dielectric constant and applying high voltage across the electrode tabs 20 of the electroactive material plates 13. Composite magnetoelectric materials may also be repoled without disassembly by simultaneous application of magnetic and electric fields while the composite is in a hot bath.

The continuous cyclic operation of this embodiment of the invention as a low voltage to high voltage inverter is realized by pulsed low voltage resistive heating of the memory wire while the converter is immersed in a suitable cold reservoir. For example, an electrically insulating cold liquid reservoir would eliminate the need to electrically insulate individual components of this embodiment of the invention.

The electroactive material in the plates 13 may be a piezoelectric material or a composite magnetoelectric material. In addition, a composite electroactive material may comprise mechanical impedance matching spring material that would obviate the need for the spring material plate 14. This increases the simplicity and versatility of the above described embodiment of the invention. The additional magnetic lines of force that would be generated by magnetoelectric material may be used to provide motor action or to focus or deflect charged particles.

The ability to specify electroactive and magnetoelectric composite material geometry and properties over a wide range of possibilities in practice of the invention permits voltage, current, and capacitive and inductive reactance matching to a broad range of electronic circuits or components. A versatile range of motor action concepts is also permitted.

Figure 3:
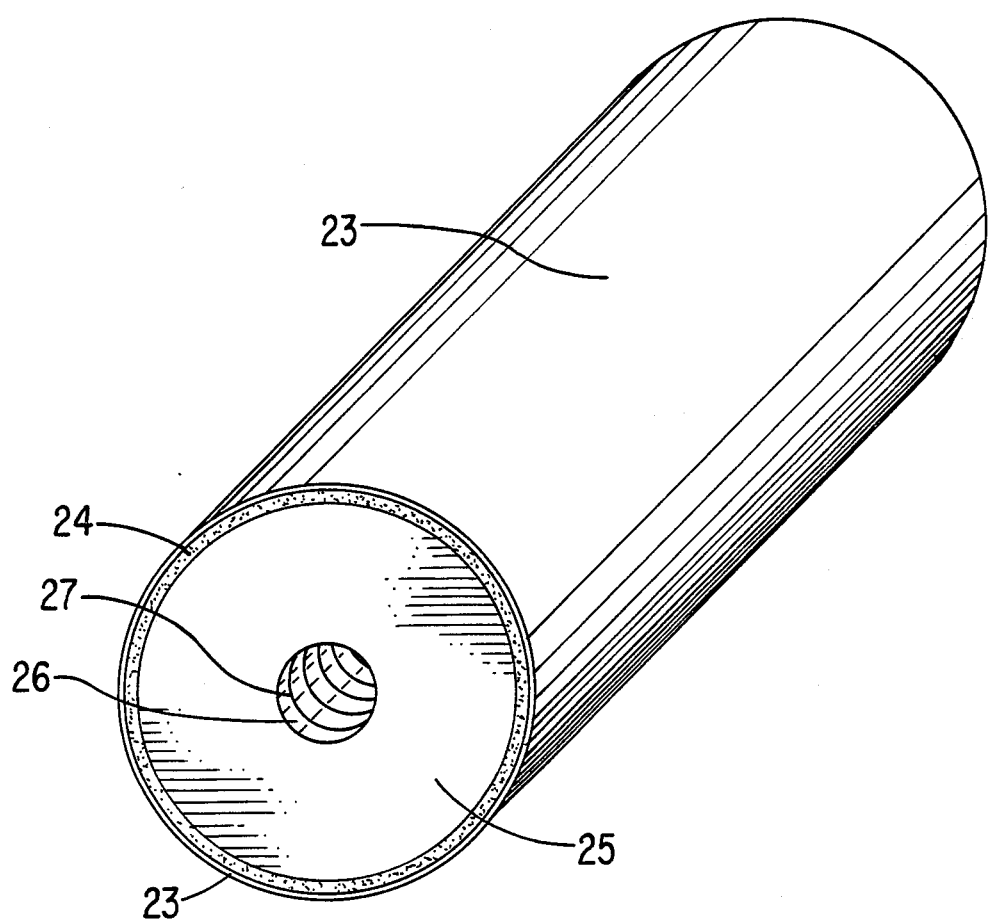
FIG. 3 illustrates in perspective view another embodiment of heat to electricity converter constructed according to the principles of this invention that is suitable for simultaneous charged particle acceleration and focusing.

FIG. 3 illustrates in perspective view another embodiment of the invention in accord with the principles of the invention wherein a thin walled cylindrical memory material tube 23 encases a pressure transmitting thermally and electrically insulating cylindrical tube 24 of material that in turn encases a cylindrical laminated and electrically bonded tube 25 comprising electroactive and magnetically active composite annular washers 26, magnetically and electrically poled parallel to the tube 25 axis and perpendicular to the annular electrode surfaces 27 of the washers 26 in a series electrical circuit arrangement. The composite material tube 25 also comprises a pressure transmitting spring material for mechanical impedance matching. This embodiment of the invention may be operated as a particle acceleration and focusing device for charged particles travelling along the axis of the hollow cylindrical tube 25.

Alternatively, the outer memory material tube 23 may be replaced with a metal tube, while the thermally and electrically insulating material tube 24 is replaced by a tube comprising electrically insulating polymer or polymer composite memory material. Hot-cold-strain cycling of this embodiment of the invention will also generate electric and magnetic force fields, however the cycling rate may have to be significantly reduced due to the generally lower thermal conductivity and subsequently longer response time of the composite memory material.

Figure 4:
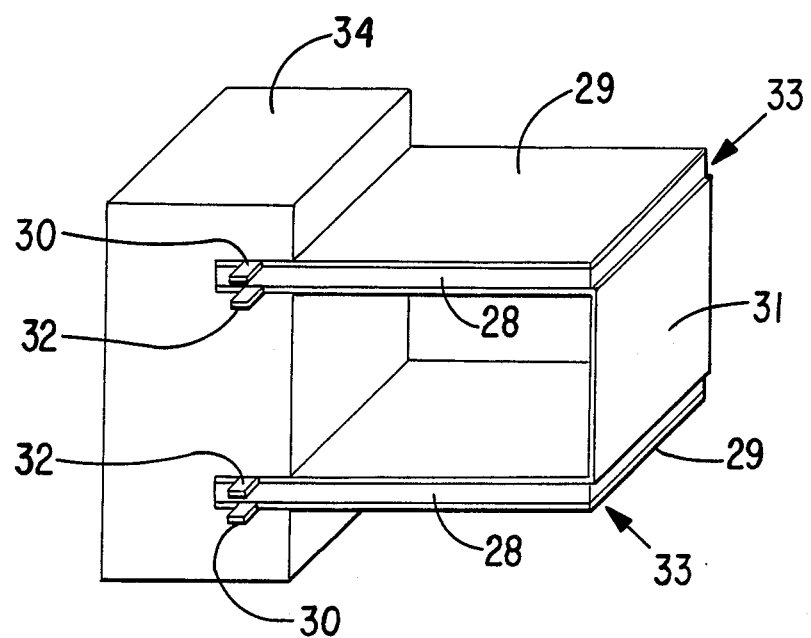
FIG. 4 illustrates in perspective view another embodiment of heat to electricity converter constructed according to principles of this invention featuring memory material activated piezoelectric benders.

FIG. 4 illustrates in perspective view another embodiment of the invention in accord with the principles of the invention wherein two wafers of electroactive materials 28 are laminated to electrode materials 29 having protruding electrical output electrodes 30 and to a single ribbon of memory foil 31 that also has protruding electrical output electrodes 32, to form a new type of what are commonly called benders 33. The benders 33 are, in turn, embodied, for example by means of casting or bonding, in a block 34 of electrically insulating material in a clamped parallel arrangement, with the memory foil 31 having a U shape. Heat reaching the exposed surface of the properly annealed memory foil 31 will contract the foil in the vertical plane and bend the electroactive materials 28 together. Hot-cold-strain cycling of the memory foil will generate a time varying electrical potential at the electrical output electrodes 30 and 32.

Figure 5:
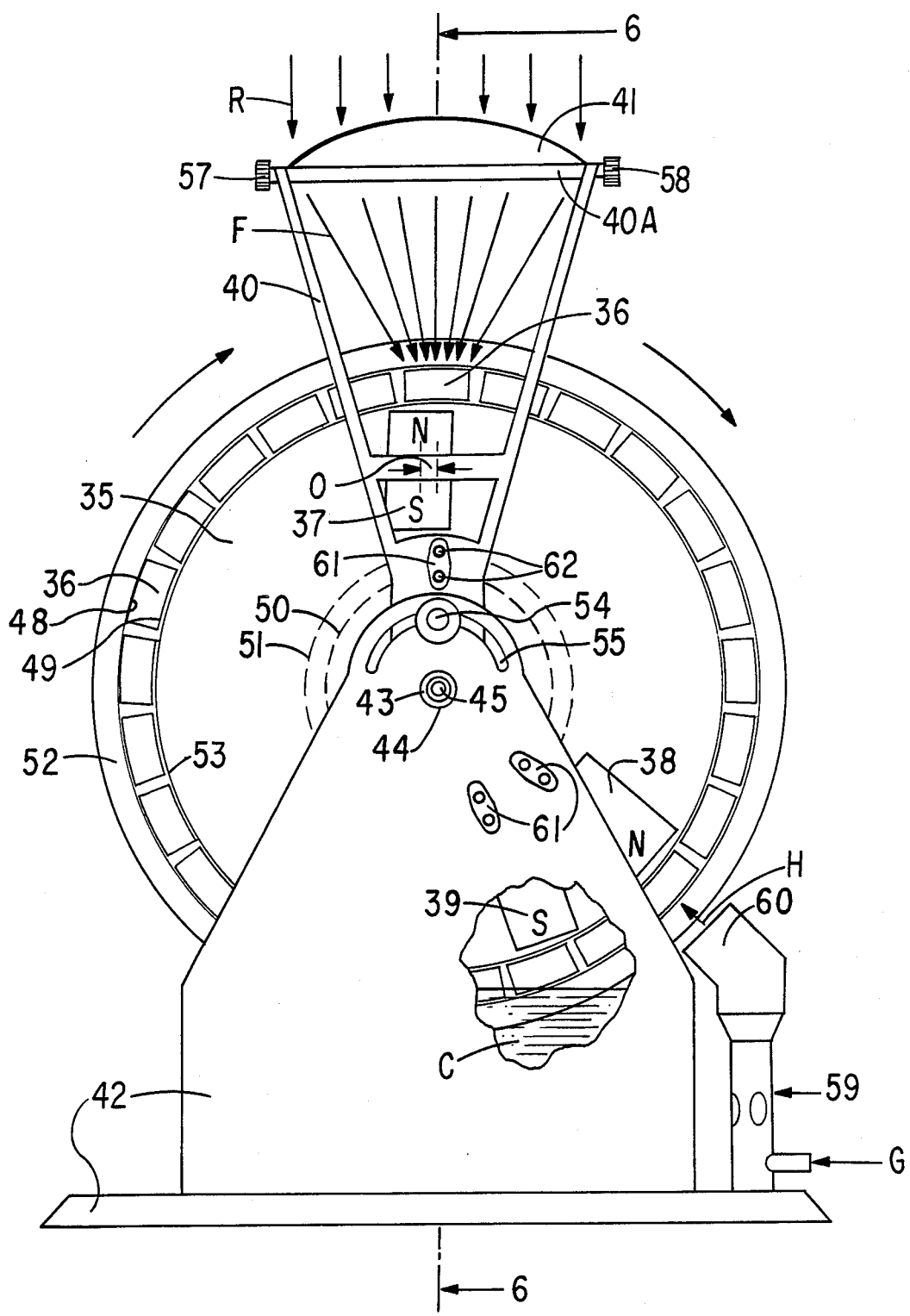
FIG. 5 illustrates in elevation view, partly in section, another embodiment of heat to electricity converter constructed according to principles of this invention that provides automatic hot-cold-strain cycling of memory materials.
Figure 6:
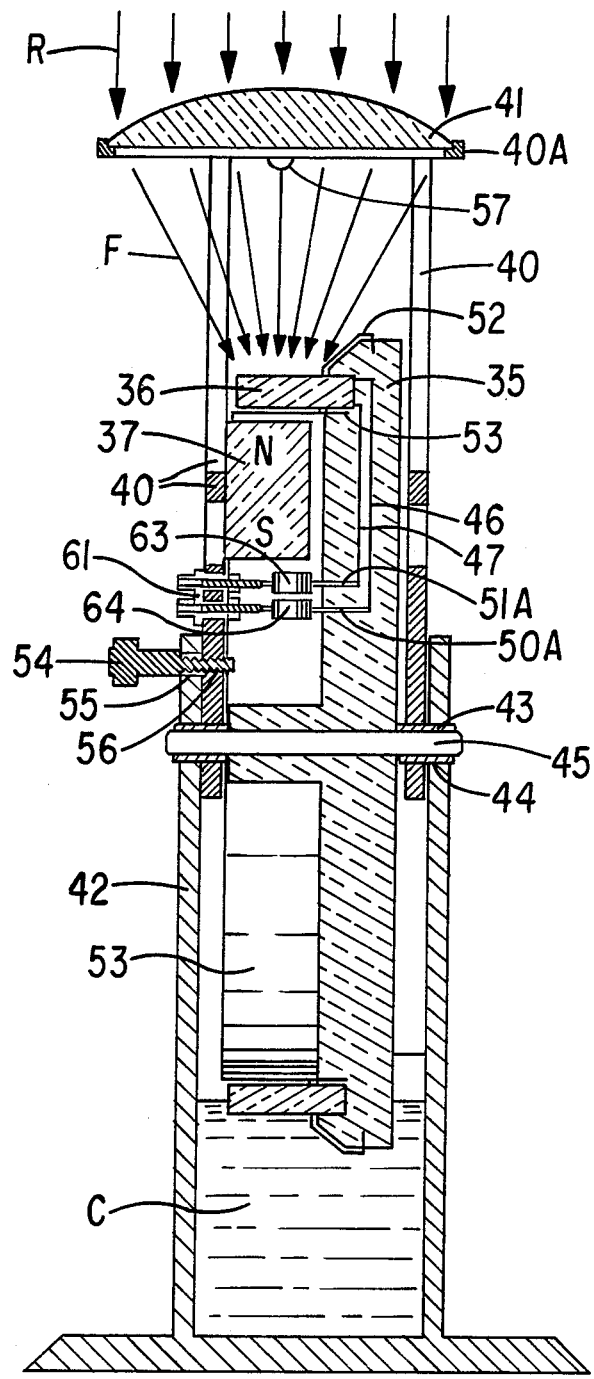
FIG. 6 is a side view, taken along line 6—6 of FIG. 5.

FIGS. 5 and 6 illustrate an embodiment of the invention constructed in accord with the principles of the invention that provides relatively noise free automatic hot-cold-strain cycling of memory materials, the alternate us of solar radiation R or a combustible gas G as heat sources, and a cold liquid C for cooling. Rotational drive of a disk 35, in a clockwise direction as shown in FIG. 5, is accomplished through the action of magnetic forces which impart a torque to the disk 35. The magnetic forces arise when a plurality of magnetoelectric composite benders 36 embedded in the disk 35 are hot-cold-strain cycled in proximity to suitably poled and placed magnets 37, 38, and 39. The composite benders may also comprise mechanical impedance matching spring material. The upper permanent magnet 37 is attached, for example by bonding, to a rotatable frame 40. The frame 40 also functions as a mounting for a solar radiation concentrating lense 41 attached to the frame segment 40A, for example, by bonding. The rotatable frame is mounted on a combination cold liquid C reservoir-stand 42 by means of bearings 43 that are press fit into openings 44 in the reservoir-stand 42. The bearings 43 also journal an axle 45 to which the disk 35 is attached by means of, for example, casting. Casting of the disk 35 may also provide suitable mounting of the benders 36, electrical wires 46 and 47 (FIG. 6) that connect each laminated bender electrode 48 and 49 to correspondingly segmented commutator rings 50 and 51, and heat shields 52 and 53 which protect the disk 35 and magnets 37 and 38 from excessive heat. A clamping knob-screw assembly 54 passes through a curved slot 55 in the reservoir-stand 42, and friction loads the rotatable frame 40 against the reservoir-stand 42 when the assembly 54 is screwed into threads 56 in the frame 40 as shown in FIG. 6. This arrangement allows adjustment of the lense 41 axis to coincide with the direction of incident solar radiation R in the plane of view illustrated in FIG. 5. In a similar manner, FIG. 5 shows clamping knob-screw assemblies 57 and 58 that friction load the frame 40 against the frame segment 40A, and allow adjustment of the lense 41 axis in the plane illustrated in FIG. 6.

Referring again to FIG. 5, the axis of the magnet 37 is offset a distance 0 from a radial line connecting the center of the disk 35 and the centers of the top bender 36 and focused radiation F in the position shown. The benders 36 are magnetically poled to provide an opposing north pole to the north pole N of the magnets 37 and 38 when the outer laminated memory material electrodes 48 are heated by focused radiation F, or by heat H directed from a gas G fueled burner 59. The burner 59 is attached, for example, by bonding, to the base of the reservoir-stand 42, with the center line of the burner nozzle 60 and heat H flow coinciding with a radial line connecting the disk 35 center and the center line of a bender 36 in the position shown in FIG. 5. The axes of the lower stationary magnets 38 and 39 are, in a manner identical to that shown for upper magnet 37, also offset a distance 0 from radial lines that connect the disk 35 center and the center lines of benders 36 in the positions shown in FIG. 5. The offsets 0 are provided to assure rotation of the disk 35 in the clockwise direction shown in FIG. 5, and to provide optimum torque to the disk as the benders pass through either of the heating regions or the cold liquid C. The lower magnet 39 will be especially effective in imparting a clockwise rotational torque to the disk 35, since this magnet 39, having a south S pole orientation towards the benders 36, will tend to attract benders that still have remaining interior north pole strength subsequent to heating of the outer laminated memory material electrodes 48, while also providing additional clockwise torque to the disk 35 as each bender 36 moves into the cold liquid C, reverses magnetic pole orientation, and is simultaneously repulsed by the south S pole of the lower magnet 39. The two lower magnets 38 and 39 are attached, for example, by bonding means to the combination reservoir-stand 42.

Again referring to FIG. 5, three identical electrically insulated dual female jack electrical output receptacles 61 are mounted in proximity to the three magnets 37, 38, and 39 in a manner such that a line connecting the centers of the dual jacks 62 in each receptacle 61 coincides with radial center lines connecting the disk 35 axis to the center lines of the benders 36 in the positions shown, and such that the two projected axes of each pair of dual jacks 62 will coincide with the two corresponding circumference lines of the two segmented commutator rings 50 and 51.

Figure 7:
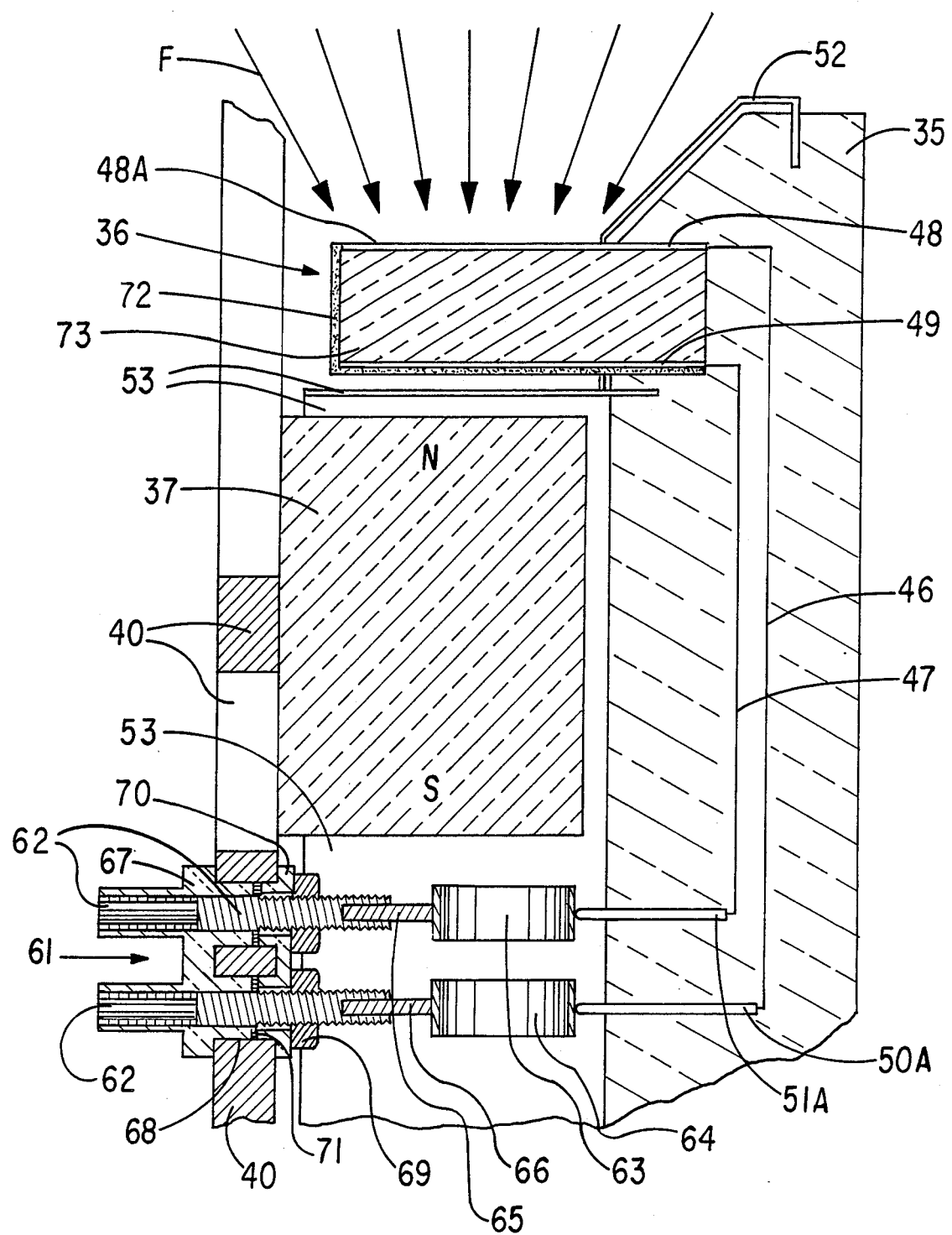
FIG. 7 is an enlarged detail view of a portion of FIG. 6.

Now referring to FIGS. 6 and 7, the above described arrangement facilitates electrical transfer of the time varying electrical potential generated by each bender 36 from the electrodes 48 and 49, through wires 46 and 47 connected between each pair of electrodes 48 and 49 and the commutator ring segments 50A and 51A, and through brushes 63 and 64 that are attached by means of rods 65 and 66 (FIG. 7) to each of the dual jacks 62. The brushes 63 and 64 are split cylindrical rings that are suitably spring loaded against the commutator ring segments 51A and 50A respectively to assure electrical continuity during rotation of the disk 35. Attachment and electrical connections of the wires 46 and 47, and rods 65 and 66 may be made, for example, by spot welding and/or soldering.

Referring again to FIG. 7, one electrically insulated dual female jack electrical output receptacle 61 is mounted on the frame 40 in a manner such that the threaded jacks 62, being embedded in an insulating material holder 67, pass through matching openings 68 in the frame 40, and hold the receptacle 61 in place by means of nuts 69 that bear on a matching dual washer plate 70 that, in turn, clamps the receptacle 61 to the frame 40. The dual washer plate 70 is composed of an insulating material identical to that of the holder 67. Washers 71 between the holder 67 and the plate 70 are composed of a suitable compliant insulating material and serve to further electrically insulate the receptacle 61.

The two receptacles 61 shown in proximity to the lower magnets 38 and 39 in FIG. 5 are incorporated on the reservoir-stand 42 in a manner identical to that shown in FIG. 7 to provide useful electricity at the output receptacles 61.

FIG. 7 also illustrates the manner in which a suitable electrically and thermally insulating coating 72 is applied to the magnetically and electrically active composite material 73 of each bender 36 and to the electrodes 48 and 49, with the exception of those portions 48A of the electrodes 48 that are exposed to focused radiation F, or heat H from the burner 59 shown in FIG. 5. The coating 72 provides protection against any loss of useful electrical energy generated by the benders 36 as they pass through the cold liquid C, where the cold liquid C may be an electrically conductive substance, such as water.

From the above description and consideration of prior art relating to electric motors and generators, it will be apparent that application of an electrical potential or AC power to any one of the receptacles 61 will provide motor action of the disk 35. This is due to the fact that a magnetoelectric composite will produce a magnetic field whether the varying strain in the composite that produces magnetostriction and a resultant varying magnetic field is produced by memory material acting on the composite or by the application of an electrical potential to magnetoelectric composites that gives rise to time varying strains in the composites. Thus, one may consider simplified versions of motors that utilize magnetoelectric composite materials where the motors do not require field windings, armatures and commutators, or memory materials to produce the necessary strains.

As mentioned in the above BACKGROUND section, memory materials have been reported that do not require additional spring means to return the material to a desired geometry on cooling. Therefore, in the above embodiments of the invention that comprise mechanical impedance matching spring material, the spring material may be omitted when memory materials having appropriate spring action on cooling and having appropriate mechanical impedance matching properties are embodied in the invention.

Several embodiments of heat to electricity and electromagnetic energy converters incorporating principles of the invention have been described. Several embodiments of the converters and an automatic hot-cold-strain cycling system incorporating principles of the invention have also been described and illustrated herein. Many other arrangements for heat to electricity converters, hot-cold-strain cycling systems, and systems comprising magnetoelectric composites that produce motor action will be apparent to one skilled in the art. Because of the many possible modifications and variations, it is to be understood that within the scope of the appended claims, the invention may be practiced otherwise than as specifically described.

What is claimed is:

1. A heat to electricity converter comprising:
  a memory material wire having sufficient length to provide a coil-like winding encasement under a pressure of several hundred pounds per square inch of the following stack of plates:

two identical electrically and thermally insulating prismatic pressure plates having memory wire guide and attachment means for the ends of said memory material wire and for electrical contact electrodes, said electrodes facilitating resistive heating and rejuvination of said memory material wire, wherein said identical plates form the top and bottom of said stack;

a rectangular parallelopiped block of laminated electroactive plates having electrically conductive electrode surfaces, said electrode surfaces extending beyond the surfaces of said electroactive plates to facilitate electrical output connections;

a mechanical impedance matching rectangular pressure transmitting spring material plate;

wherein said memory material wire has sufficient cross sectional area and number of said winding turns to provide approximately 7,000 pounds per square inch of compressive pressure to said stack of plates during the heating portion of hot-cold-strain cycling of said memory material wire, and whereby said cycling causes contraction of said memory material wire during heating and expansion during cooling, said contraction and expansion producing increasing and decreasing pressure on said electroactive plates, thereby generating a useful alternating electrical potential at said electroactive plate electrode surfaces.

2. A heat to electricity converter as defined in claim 1 wherein means to cool said memory material wire and means to provide pulsed low voltage resistive heating of said memory material wire allows continuous cyclic operation of this embodiment of the invention as a low voltage to high voltage inverter.

3. A heat to electricity converter as defined in claim 1 wherein said laminated electroactive block of plates comprises magnetoelectric composite and additional spring material embodied in said composite, and wherein said mechanical impedance matching pressure transmitting spring material plate is omitted, and whereby hot-cold-strain cycling of said memory material acts to generate an alternating electrical potential and an alternating magnetic field in and around said block, and whereby said alternating magnetic field may be used to provide motor action or charged particle deflection and focusing.

4. A heat to electricity converter as defined in claim 1 wherein said memory material wire has spring action on cooling, wherein said memory material wire has mechanical impedance matching properties, and wherein said mechanical impedance matching pressure transmitting spring material plate is omitted.

5. A heat to electricity converter capable of charged particle acceleration and focusing comprising, in combination:

a tube of annular laminated and electrically bonded magneto-electric composite material washers, said tube being electrically and magnetically poled parallel to said tube axis;

a tube of electrically and thermally insulating material, said tube encasing said magnetoelectric composite tube;

an outer tube of memory material, said outer tube encasing said insulating material tube and said composite tube;

whereby hot-cold-strain cycling of said outer memory material tube generates a time varying stress in said composite tube and whereby said composite tube generates resultant time varying parallel axial electric and magnetic lines of force along the interior of said composite tube.

6. A heat to electricity converter as defined in claim 5 wherein said memory alloy tube is replaced by a metal tube, and wherein said insulating material tube is replaced by a tube of electrically insulating memory material.

7. A heat to electricity converter as defined in claim 5 wherein said magnetoelectric composite tube also comprises mechanical impedance matching spring material.

8. A heat to electricity converter comprising, in combination, two electroactive laminate benders, said benders having attachment means and being attached to an electrically insulating block, said benders having electrical output electrodes, said benders being bonded to a single ribbon of memory material foil, said foil forming a sharp cornered U shape having said benders as parallel sides, said converter having exposed memory foil between the ends of said benders, said ends being opposite to those having attachment means to said block, and whereby hot-cold-strain cycling of said memory material foil produces a time varying strain in said benders, said benders thereby generating a time varying electrical potential at said bender electrical output electrodes.

9. A heat to electricity converting system comprising, in combination, a plurality of magnetoelectric composite heat to electricity converting benders, said benders having laminated memory material foil and electrode surfaces, said benders having parallel magnetic and electric field poling, means for mounting and electrically insulating said benders near the perifery of a rotatable disk, means for mounting said rotatable disk in a combination cold liquid reservoir-stand, means for mounting and moving a solar radiation concentrating lense, a magnet, and an electrical output means in unison such that said lense will concentrate solar radiation onto said memory material foil surface and thereby cause contraction of said memory material foil and activation of said bender, thereby simultaneously producing stress in said bender, a time varying electrical potential at said bender electrodes, and a time varying magnetic field in and around said bender, said field thereby generating forces between said bender and said magnet, wherein said magnet is proximate to said producing bender, said forces thereby imparting a unidirectional rotational torque and motor action to said rotatable disk and thereby rotating subsequent benders into proximity with said lense concentrated solar radiation while also rotating said producing bender towards said cold liquid reservoir, wherein segmented commutation means, electrical insulation means, and electrical connection means between each of said bender electrodes and each segment of said commutation means are embodied in said disk so as to provide electrical continuity from said electrodes, through spring loaded brushes contacting said segmented commutation means, and to said electrical output means, wherein an alternate nonsolar stationary heating means concentrates heat onto each of said memory foil surfaces of said benders, in turn, as each of said foil surfaces rotates into proximity with said heating means, wherein two magnets, two electrical output means, and two stationary brush and attachment means are mounted by attachment means onto said reservoir-stand in proximity to said benders, to said alternate heating means, and to said cold liquid in a manner such that said alternate heating means activates said benders and thereby provides a magnetic field induced torque to unidirectionally rotate said disk, and whereby said benders subsequently pass into said cold liquid reservoir, whereupon said benders reverse electrical and magnetic polarity as said memory material expands on cooling, whereby said reversal of magnetic polarity of said benders creates a force between said benders and said cold liquid proximate magnet and thereby imparts additional unidirectional rotation to said disk, and whereby said electrical polarity reversals of said benders generate alternating electrical potentials, said generated potentials being available for use at said reservoir-stand mounted electrical output means.

10. A heat to electricity converting system as defined in claim 9 wherein heat shields having attachment means are attached to said disk in a manner to protect said disk and said magnets from excessive heat.

11. A heat to electricity converting system as defined in claim 9 wherein a thermally and electrically insulating coating is applied to said benders in a manner excluding said memory material surfaces that are exposed to heating and cooling, and in a manner such that electrical energy losses will not occur when said cold liquid is capable of conducting an electrical current.

12. A heat to electricity converting system as defined in claim 9 whereby application of an electrical potential to any one on said electrical output means will provide motor action, and whereby operation of said system to provide said motor action by the application of an electrical potential to said electrical output means allows omission of said memory material, said alternate heating means, said lense, and said cold liquid.

13. A heat to electricity converting system as defined in claim 9 wherein said magnetoelectric composite benders also comprise a mechanical impedance matching spring material.

* * * * *